(12) United States Patent
Moizio et al.

(10) Patent No.: US 6,476,932 B1
(45) Date of Patent: Nov. 5, 2002

(54) DIGITAL RESOLUTION TRANSLATOR

(75) Inventors: Frank J. Moizio, Dallas, TX (US);
Edward C. Musall, Plano, TX (US);
Martin A. Wand, Plano, TX (US);
Steve T. Jenkins, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/899,969

(22) Filed: Jul. 24, 1997

(51) Int. Cl.[7] .................................................. G06K 1/00
(52) U.S. Cl. .......................... 358/1.2; 358/1.9; 341/120
(58) Field of Search ................................. 358/298, 448, 358/1.2, 1.9, 1.6, 1.12, 1.13; 395/112, 128, 102, 109; 382/209, 260, 298; 341/50, 118, 120

(56) References Cited

U.S. PATENT DOCUMENTS

| | | | | |
|---|---|---|---|---|
| 3,731,196 A | * | 5/1973 | Young ..................... 324/0.5 E |
| 4,458,214 A | * | 7/1984 | Lakomy .................... 331/1 A |
| 4,687,933 A | | 8/1987 | Loy ......................... 250/334 |
| 4,843,229 A | * | 6/1989 | Reed et al. ........... 250/213 VT |
| 5,237,521 A | | 8/1993 | Raj et al. .................. 364/561 |
| 5,438,353 A | | 8/1995 | Morrison .................... 347/250 |
| 5,517,230 A | | 5/1996 | Lofthus et al. ............. 347/235 |
| 5,619,246 A | * | 4/1997 | Straayer et al. ............. 347/262 |
| 5,689,343 A | * | 11/1997 | Loce et al. ................. 358/298 |
| 5,719,782 A | | 2/1998 | Mitsuoka .................... 364/484 |
| 5,793,406 A | * | 8/1998 | Trask et al. ................. 358/298 |

FOREIGN PATENT DOCUMENTS

GB        2 281 633 A    3/1995

* cited by examiner

Primary Examiner—Mark Wallerson
Assistant Examiner—Twyler Lamb
(74) Attorney, Agent, or Firm—Charles A. Brill; Wade James Brady, III; Frederick J. Telecky, Jr.

(57) ABSTRACT

A method and system for digital resolution translation. An input frequency is received, as is a desired output frequency. The desired output frequency is measured directly and compared with the input frequency. The specified output frequency is dynamically adjusted to compensate for variations in the input frequency, while a fixed relationship between the input and output is kept intact. The relationship between the input and output frequencies can be arbitrary, non-integer or integer. The system consists of an execution process (54) and the adjusted output frequency is sent to a system as a sampling signal. The system reset/restart capability allows for a repeatable phase relationship between the output and the input from any given reset point.

20 Claims, 4 Drawing Sheets

DIGITAL RESOLUTION TRANSLATOR

BACKGROUND OF THE INVENTION

1. Field of the Invention

This invention relates to position-based sampling systems, more particularly those systems which contain fixed resolution transducers and require non-integer modification from the resolution provided by the transducer.

2. Background of the Invention

Position-based sampling is a technique that can be applied to a broad category of systems such as printers and other imaging systems. In printers, the exposure or image is a result of image data positioned on a photoreceptor drum and ultimately onto a piece of paper or film. Imaging systems, such as night vision systems, typically use a scanner to position infrared energy onto a detector, which is then converted into a visual image via electronic processing. In both cases, the accuracy of the position from which the photoreceptor (in printers) and detector (in scanned imaging systems) sample incremental portions of the image data determines the accuracy of the image.

These types of systems may employ time-based or position-based techniques to achieve desired results. Time-based systems assume that the photoreceptor drum speed and scanner speed are constant during imaging. Positioned-based systems assume that photoreceptor drum and scanner speed are not constant and vary as a function of changing friction, wear, and speed control inaccuracies.

Since positioned-based techniques comprehend speed anomalies, they are typically more accurate than time-based systems. Positioned-based techniques rely upon the use of transducers to feed mechanical position information to tell the imaging system when to sample. Mechanical transducers with digital outputs, such as optical encoders, can be used in these applications, but they have fixed resolutions that do not necessarily match desired system resolutions. Hence, an electronic technique for converting the digital transducer resolution to the resolution desired by the system while keeping the phase relationship between transducer and converted output intact is necessary to achieve desired imaging system resolution.

For example, image data may be required to be sampled at 600 dots per inch for a printing system. However, photoreceptor position transducer information may be limited to producing 300 dots per inch. In this case, a phase-lock loop can be used to electronically increase photoreceptor position transducer data from the required sampling resolution by a factor of 2. The phase-lock loop also preserves phase integrity during the translation process and filters out high frequency noise.

In reality, the photoreceptor position information may have an effective resolution of 275.9704 dots per inch due to a mechanical photoreceptor circumference of 14.84217 inches and an optical encoder resolution of 4096 pulses per revolution. In this case, a non-integer relationship of 2.17415 exists between the photoreceptor position information and the desired sample resolution of 600 dots per inch. Since phase-lock loops are limited to integer divisions of the VCO clock output and input data, they are limited by the size of the counter/dividers used in the hardware an, therefore, cannot directly create an arbitrary, non-integer or fractional relationship between the incoming transducer data and the outgoing image data sampling rate. Traditional techniques have not addressed this non-integer scale factor problem.

Therefore, a solution is needed that provides a technique for non-integer translation resulting in a more precise relationship between input resolution and desired output resolution, while preserving phase integrity between the input and the output and filtering high frequency noise present on the input.

SUMMARY OF THE INVENTION

One aspect of the invention provides for the generation of a specified output frequency which is synchronized in position and filtered with respect to a given input frequency. The output frequency can be virtually any non-integer relationship with respect to the input frequency within the sampling constraints of the specific implementation. The invention employs an all digital closed loop system whereby the specified output frequency is directly measured and used as feedback. The direct measurement of changes in the output signal in conjunction with the closed loop architecture provides an output that accurately tracks the input and minimized quantization error.

Another aspect of the invention provides for reset/restart with minimal disturbance to loop error, allowing for a repeatable phase relationship between the output and the input from any given reset point.

Embodiments of the invention allow for a position based flashing spatial light modulator within a printer application and can be featured in a wide number of other spatial light modulator based systems as well as a myriad of unrelated implementations.

It is an advantage of the invention in that it does not require an integer relationship between the input command and the desired output frequency.

It is an advantage of the invention in that it uses the desired non-integer output frequency directly as a feedback resulting in less quantization error for superior and optimal dynamic tracking of the input.

It is an advantage of the invention in that the relationship between input and output can be easily changed within the system sampling constraints.

It is a further advantage of the invention in that it results in a more precise static relationship between the input and the desired output.

It is a further advantage of the invention to have selectable bandwidths.

It is a further advantage of the invention in that, when employed in a printer application, it can remove the need for a flywheel which is typically attached to the photoreceptor drum.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE PREFERRED EMBODIMENTS

Figure 1A:
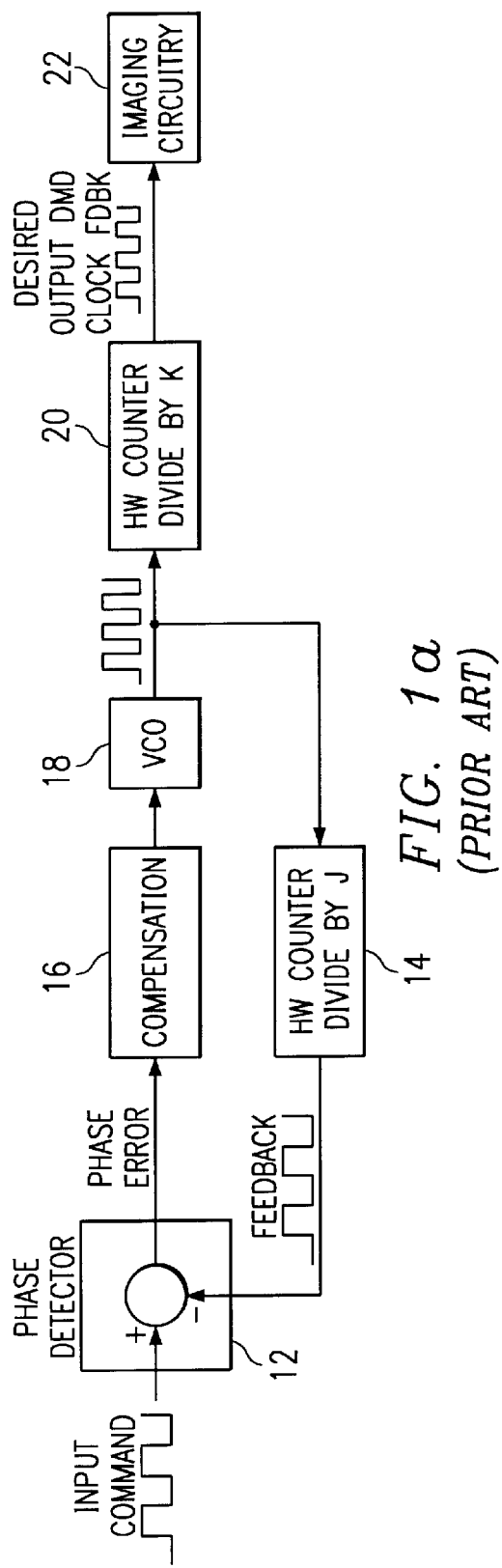
FIGS. 1a and 1b are a block diagram of a prior art phase lock loop, and its timing diagram, respectively.

As discussed above, phase lock loop (PLL) design limitations do not allow arbitrary relationships between the input and output waveforms. One example of such a prior art PLL is shown in FIG. 1.

This prior art example of a PLL can be used in printing systems. However, this is in no way intended to restrict the applications of any embodiments of the invention to printing systems alone, as will be discussed further. The PLL receives an input command into a phase detector 12. In this example, the input command is a signal representative of the position of an optical photoreceptor (OPC) in a printing system. These photoreceptive surfaces are typically drums or belts.

The phase detector 12 also receives a feedback signal from the hardware counter 14. The hardware counter 14 divides the output of the forward path of the loop by an integer J. J represents the relationship between the resolution on the OPC and the output resolution. The output resolution is that of the imaging circuitry 22, which could be any circuitry that forms the latent image on the OPC by controlling the light sent to the OPC. Types of this circuitry include laser polygon scanners, spatial light modulators and LED arrays.

The difference between the forward loop and the feedback loop results in a phase error which is adjusted by a compensation added to the forward loop at 16. This compensation is implemented by a voltage-controlled oscillator (VCO) 18 that makes the adjustment in the output resolution as necessary.

Figure 1B:
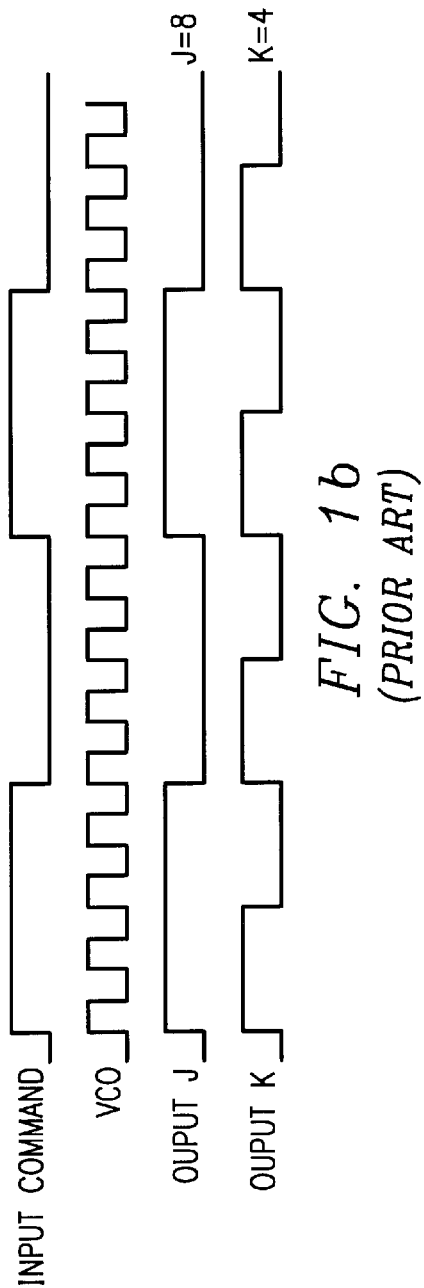

If finer adjustment is needed in the resolution adjustment, an additional divide by K counter 20 could be used. This allows for one more integer adjustment of the output resolution before the signal is sent to the imaging circuitry which controls latent image exposure on the OPC at the adjusted resolution. The relationship between the input command, the VCO commands and the two integer counters are shown in FIG. 1*b*.

As mentioned previously, this current embodiment of a PLL does not allow for arbitrary non-integer relationships between the input signal provided by a transducer on the OPC and the output image sampling signal. The use of integer-only relationships results in a system that is less precise than it needs to be as discussed above. This is especially true when the printing system is a color printing system with stringent resolution requirements.

Color printing systems are typically implemented in one of two ways. The paper onto which is transferred the latent image from the OPC passes once around the paper path, and receives the four different colors of toner in sequence. Alternatively, the paper makes four passes around the paper path and receives one toner color each time. The paper path may be a drum or a belt system. Regardless of which implementation, or any other implementation of the paper path, the proper amount of each color toner must be deposited in the correct position for each picture element (pixel) of the final image.

For example, one part of the image may be a combination of cyan and magenta. In order for that part of the image to be correctly portrayed on the paper, the proper amounts of cyan and magenta must be deposited in a precise place on the paper. If either one of the colors is off in its registration, that portion may appear to have either a cyan or magenta edge when the colors missed each other. This is a result of poor or imprecise color registration.

In a position-based system, poor resolution translation both dynamically and statically can cause misregistration. In dynamic terms, poor resolution adjustment results from the inability of the system output to track and follow the input accurately. Since the OPC does not spin at exactly a set revolution per minute, variations in OPC speed comprehended by a transducer, (typically, but not limited to, an optical encoder which serves as the system input), must be closely replicated by the system output (which serves as the sampling frequency of the image exposure onto the drum).

For instance, the system may be designed for the OPC to spin at 3600 rpm, but because of dynamic variations in friction level from various mechanical components the OPC speed may vary from 3564 rpm to 3636 rpm. If the system cannot follow the differential between the actual and the nominal set speed, the result is that the same pixel for each color plane (e.g. cyan, magenta, black, and yellow) will be exposed in a different (instead of same) location on the OPC.

Less than perfect overlay of the same pixels for each of the four color planes results in color plane misregistration. In static terms, poor resolution translation results from an imprecise relationship (e.g., the desired non-integer relationship accuracy cannot be achieved due to system limitations) between the input and output such that the desired pixel spacing cannot be achieved.

Figure 2:
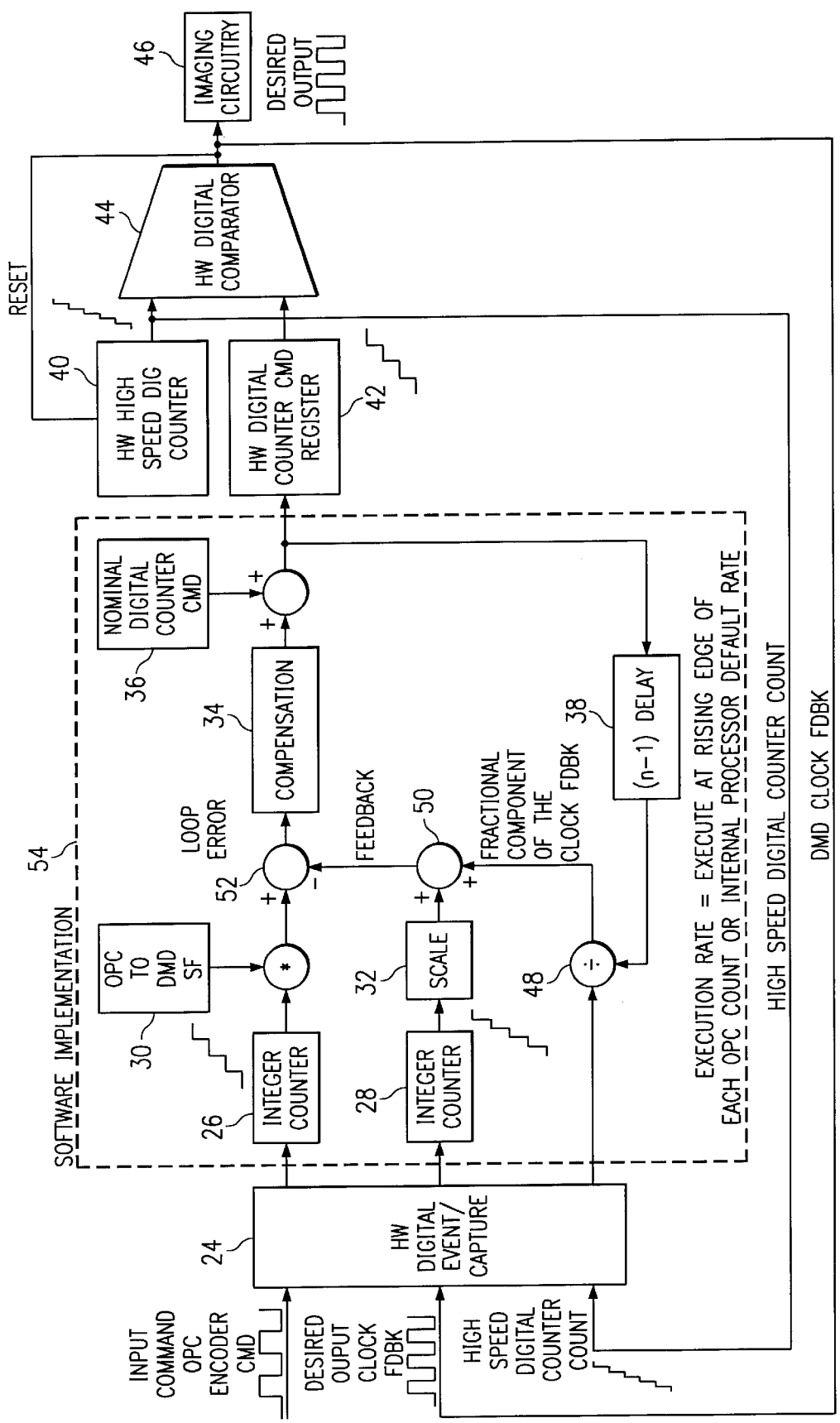
FIG. 2 shows a block diagram of one embodiment of a digital resolution translator.

One embodiment of the present invention for a digital resolution translator is shown in FIG. 2. A HARDWARE DIGITAL EVENT CAPTURE circuit 24 receives the input command (INPUT COMMAND) from the OPC encoder via a transducer such as an optical encoder, giving a rising edge at each incremental position of the OPC. It also receives a desired output frequency (DESIRED OUTPUT) representing a full cycle of the output waveform and a high speed digital counter (HIGH SPEED DIGITAL COUNTER) is used to determine the fractional cycle of the output waveform with respect to the input waveform. For each rising edge of the INPUT COMMAND the first counter 26 count is incremented and loop processing is executed.

At the same time, the number of DESIRED OUTPUT frequency rising edges that have occurred since the last execution time is recorded and counted by a second counter 28. Since, the DESIRED OUTPUT frequency can be a non-integer multiple of the INPUT COMMAND frequency, the integer number of counted rising edges of DESIRED OUTPUT between execution times based on each rising edge of the INPUT COMMAND does not truly represent the exact frequency of the DESIRED OUTPUT.

In order for the DESIRED OUTPUT frequency to be properly measured at each execution time, the measurement must include the integer count of the number of DESIRED OUTPUT rising edges that has occurred since the last execution time plus a fractional part which represents the portion of the next period that has elapsed. The fractional portion is computed at 48 as a real time divide whereby, the current count of the HIGH SPEED DIGITAL COUNTER 40 is divided by the value that has been written to the DIGITAL COUNTER COMMAND REGISTER 42 during the previous execution of the code as illustrated by the delay 38.

The current count of the HIGH SPEED DIGITAL COUNTER 40 is recorded for each rising edge of the INPUT COMMAND by the HARDWARE DIGITAL EVENT CAPTURE CIRCUITRY 24. The addition of the DESIRED OUTPUT rising edges plus the fractional portion represents the true measurement of the FEEDBACK of the DESIRED OUTPUT at each execution period for each rising edge of the INPUT COMMAND.

Hence, the FEEDBACK signal, the non-integer multiple of the input command frequency, has two parts. The first part is the integer portion of the DESIRED OUTPUT frequency counted at counter 28. The second part is the fractional portion. Mathematically the feedback can be expressed by the following equation:

FEEDBACK=DESIRED OUTPUT Integer Count+(HIGH SPEED DIGITAL COUNT/DIGITAL COUNTER COMMAND REGISTER)

The INPUT COMMAND is multiplied by the OPC-to-imaging circuitry scale factor (SF) 30. This scale factor may be an integer or non-integer value For example, the scale factor may be 2.174 rising edges of DESIRED OUTPUT for each rising edge of the INPUT COMMAND. This scaled INPUT COMMAND is then compared to the FEEDBACK at 52, resulting in a loop error. If the scale factor were 1, then, the number of rising edges for the DESIRED OUTPUT per number of rising edges of INPUT COMMAND converges on the value 1, and the loop error would be 0.

After the loop error is determined for each execution cycle (e.g., each rising edge of the INPUT COMMAND), it is multiplied by compensation 34 to ultimately minimize loop error at 52. The compensation is proportional-integral (PI). It can be determined by bilinear transformation through a discrete time implementation, among others. The invention is in no way limited to the PI implementation and can vary considerably in terms of control such as classical and/or fuzzy logic. The output of this compensation is then added to the value stored in the NOMINAL DIGITAL COUNTER COMMAND REGISTER 36, which is a constant. This constant value represents the nominal desired output. The constant is calculated by multiplying (1/(DESIRED OUTPUT)) by frequency of the HIGH SPEED DIGITAL COUNTER 40. It allows the system to start repeatedly in a know state, with a specific desired output to input relationship.

The NOMINAL DIGITAL COUNTER COMMAND REGISTER 36 plus the PI compensation output are stored in the HIGH SPEED DIGITAL COUNTER COMMAND REGISTER 42. It is used to determine the fractional portion of the FEEDBACK for the next loop time and stored at the line delay 38, as discussed above, and is compared to the count of the HIGH SPEED DIGITAL COUNTER 40 at HW DIGITAL COMPARATOR 44. When the count of the HIGH SPEED DIGITAL COUNTER 40 equals the value stored in the HIGH SPEED DIGITAL COUNTER COMMAND REGISTER 42, the imaging circuitry 46 is sent a signal to produce an output at the translated DESIRED OUTPUT.

For the next loop execution, a new DESIRED OUTPUT is received at the HW DIGITAL EVENT CAPTURE circuitry 24 and the loop executes again. When the output pulse is produced to the imaging circuitry 46, the count of the HIGH SPEED DIGITAL COUNTER 40 is set to zero and immediately begins counting up again.

As shown in FIG. 2, the tasks and registers are shown as being either implemented in software or hardware. All of the calculations shown inside the dashed box 54 are implemented in software in this example. The remaining registers and comparisons are performed by hardware. However, this is in no way intended to limit which function are implemented where. It is possible that this entire process could be implemented in software, hardware, or a different allocation of them both.

In the case of a reset/restart, the counts maintained in software are set to zero for the INPUT COMMAND and the DESIRED OUTPUT frequency. Additionally, the hardware registers for the HIGH SPEED DIGITAL COUNTER 40 are reset and a known value is loaded into the HIGH SPEED DIGITAL COUNTER COMMAND REGISTER 42. The reset/restart feature is particularly useful when a non-integer relationship is used between the system output and the system input. The reset/restart allows for a repeatable phase relationship between the output and the input from any given reset point.

Figure 3:
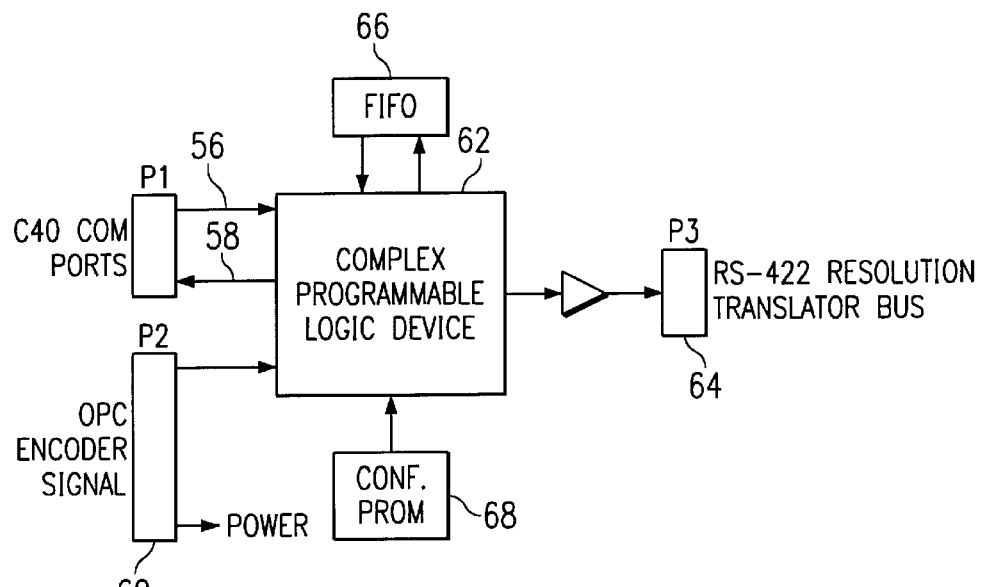
FIG. 3 is a schematic diagram of one embodiment of an interface event circuit card.

A specific hardware implementation of the invention is shown in FIG. 3, called an Interface/Event Circuit Card (IECC). This card interfaces with a digital signal processor (DSP) which implements the software implementations shown in box 54 of FIG. 2. Two unidirectional communications ports are used, a first port 56 for communications from the DSP to the IECC, and a second port 58 for communications from the IECC to the DSP. The input from the OPC encoder 60 attached to the OPC drum or belt is input directly to the complex programmable logic device 62. The logic device 62 outputs the imaging circuitry clock which is buffered using RS-422 drivers 64 before being sent to the imaging circuitry. Some implementations of the logic device 62 require that it be configured before operation. If this is necessary, the configuration data is loaded from a programmable read-only memory 68. The first-in-first-out buffer 66 stores recorded transitions from the OPC encoder signal and internal signals in the logic device 62.

Figure 4:
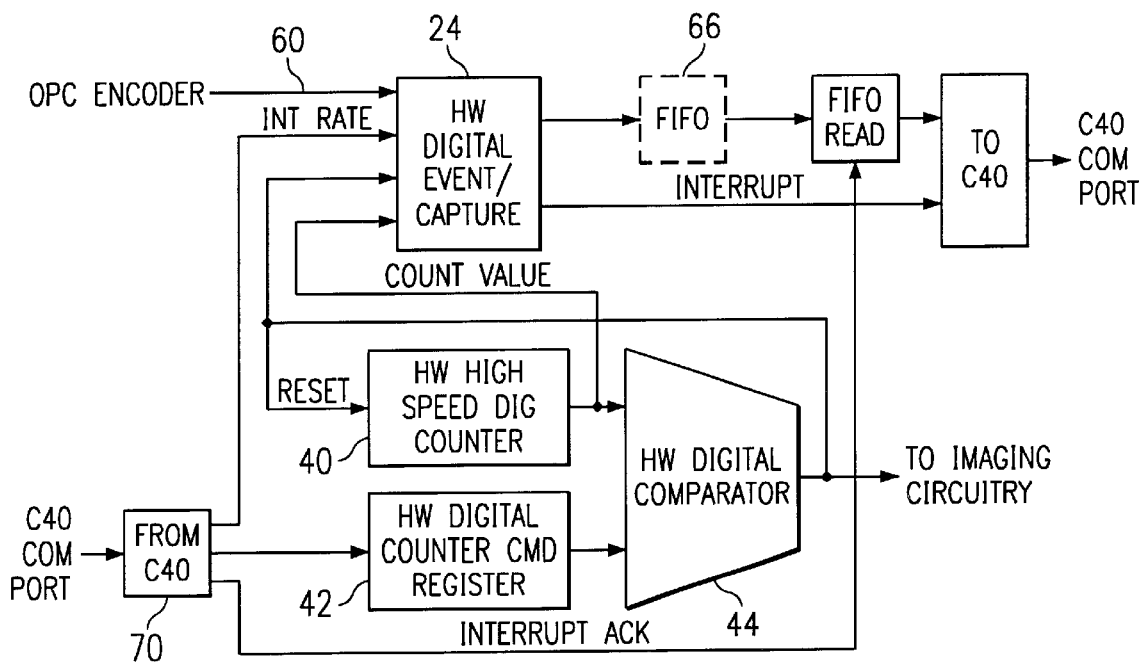
FIG. 4 is a block diagram of an interface event capture process.

A functional block diagram of the logic device 62 is shown in FIG. 4. The DSP, not shown, that implements the software functions from FIG. 2, is able to write to registers on the logic device 62 that control its operation. This is accomplished through one of the unidirectional communications port from FIG. 4, 70. The other hardware registers from FIG. 2 are contained in the logic device 62, including the HW DIGITAL EVENT CAPTURE 24, the HIGH SPEED DIGITAL COUNTER 40, the HIGH SPEED DIGITAL COUNTER COMMAND REGISTER 42, and the HW DIGITAL COMPARATOR 44. The resulting signal is then sent to the imaging circuitry 46 from FIG. 2, not shown here.

In addition, outputs may be sent to the DSP from the logic device through the other communications port on C40 from FIG. 3. A further detailed description of the HW DIGITAL EVENT CAPTURE 24 is shown in FIG. 5 as a timing diagram.

Figure 5:
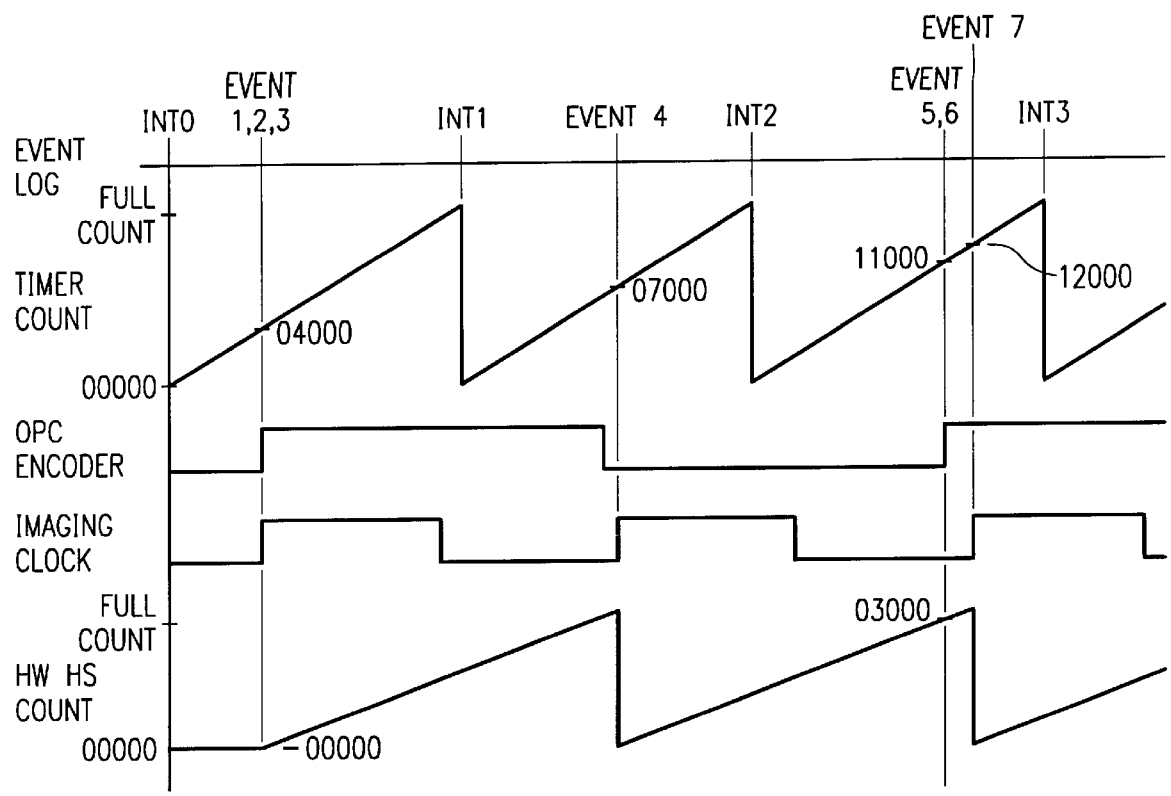
FIG. 5 is a timing diagram for an event capture.
Figure 6:
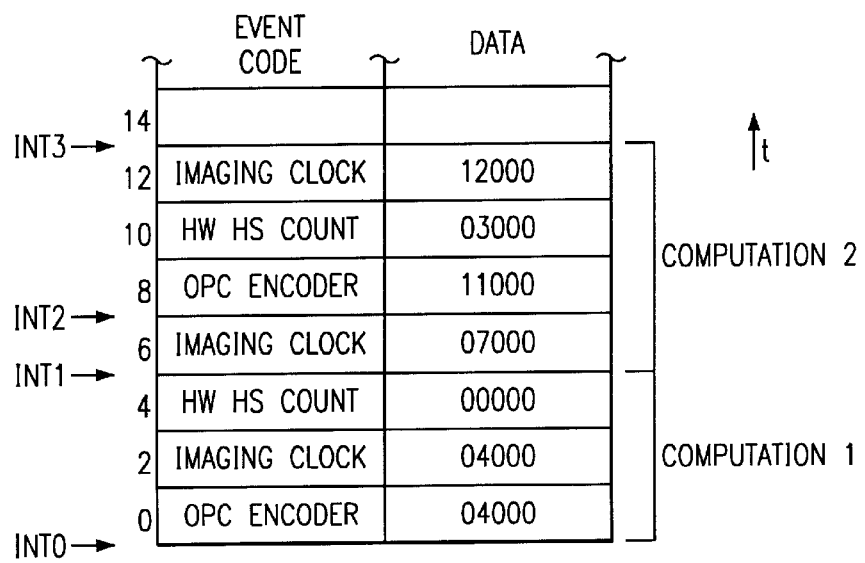
FIG. 6 is an example of event logging in a first-in-first-out memory.

The HW DIGITAL EVENT CAPTURE has a timer which generates an interrupt (INT) to the DSP as shown in the Event Log line in FIG. 5. When an event such as a rising edge of the OPC encoder signal occurs, a record is constructed and stored in the FIFO 66 from FIGS. 3 and 4. FIG. 6 shows the FIFO memory contents after three timer periods. The record consists of a keyword that identifies the event and the current timer value. In addition to the timer value, the residual count value of the HIGH SPEED DIGITAL COUNTER is included in the OPC encoder events.

As can be see in the diagram of FIG. 5, the imaging circuitry clock may have a fractional portion of a period when compared to the OPC encoder signal, shown especially on the second rising edge of the OPC encoder signal from FIG. 5. It is this fractional period that is a component used to calculate the FEEDBACK and adjust the operation of the system to optimize tracking and minimize noise. Data used in successive computations is shown in FIG. 6 as COMPUTATION 1 and COMPUTATION 2.

There are several advantages of using the above approach. It does not require customized circuitry for a specific frequency output given a frequency input. It is more precise, because the scale factor can be a non-integer. Also, the actual frequency output is directly measured by the circuitry, making the system dynamically correcting. The control loop output follows the input commands more closely and suppresses noise more effectively. Additionally, the implementation is entirely digital, taking advantage of the use of digital signal processing capabilities for precision results. The invention also provides for reset/restart with minimal disturbance to loop error. The reset/restart feature is particularly useful when a non-integer relationship is used between the system output and the system input. The reset/restart allows for a repeatable phase relationship between the output and the input from any given reset point.

As mentioned previously, this invention has been described in detail with regard to a printing system. The input commands were assumed to be from an OPC for discussion purposes. Several other applications exist for use of such a resolution translator. For example, a night-vision system with position-based input from scanners and output to detectors can use this to enhance the viewed image. The invention can be used to alter the resolution of an optical or magnetic encoder. Additionally, in telecommunications, where there is a desired carrier frequency to which the input frequency needs to lock, this resolution translator could be used to translate between the input frequency and the desired output frequency, much as it translates between the input command frequency and the output frequency for printing systems.

The more precise nature of this invention allows for better color registration, as well as dynamic adjustment of the system. In any system using such a translator, the advantages are more precision and enhanced dynamic adjustment made to track input variations.

It is an advantage of the invention in that it can remove the need for a flywheel, typically attached to photoreceptor drums. The flywheel is often used to increase the accuracy of the photoreceptor drum speed. However, since the invention translates photoreceptor position information to the desired system resolution image sampling frequency, (with maximal bandwidth, minimized quantization error, and a constant phase relationship), wider variations in photoreceptor speed are more tolerable eliminating the need for a flywheel to be attached to the photoreceptor drum.

Thus, although there has been described to this point a particular embodiment for a method and system for digital resolution translation, it is not intended that such specific references be considered as limitations upon the scope of this invention except in-so-far as set forth in the following claims.

What is claimed is:

1. A method of generating an output waveform, comprising the steps of:
    measuring an input waveform frequency by incrementing an input waveform counter for each pulse of said input waveform;
    measuring an output waveform frequency by incrementing an output waveform counter for each pulse of said output waveform;
    scaling said input waveform counter to obtain a scaled input waveform value;
    comparing said scaled input waveform with said measured output waveform to obtain a loop error value;
    generating said output waveform using said loop error value; and
    repeating said steps such that said output waveform frequency has a non-integer relationship to said input waveform frequency.

2. The method of claim 1 wherein said input waveform is received from an encoder.

3. The method of claim 2 wherein said encoder is attached to an optical photoreceptor in a printing system.

4. The method of claim 2 wherein said encoder is attached to a detector of a night vision system.

5. The method of claim 1 wherein said operating signal is sent to imaging circuitry to produce an image.

6. The method of claim 5 where said imaging circuitry is a print engine.

7. The method of claim 5 wherein said imaging circuitry is the output of a night vision system.

8. A method of generating an output waveform, comprising the steps of:
    receiving an input frequency;
    receiving a desired output frequency and incrementing an integer counter for each pulse of said desired output frequency;
    calculating a feedback signal by adding the count from said integer counter to a fractional portion, wherein said fractional portion is substantially equal to a count of a high speed digital counter divided by a compensated nominal output from a previous loop cycle;
    scaling said input frequency and comparing said scaled input frequency to said feedback signal to find a loop error value;
    applying a compensation to said loop error value, resulting in a compensated loop error;
    adding said compensated loop error to a predetermined nominal output and storing said value as a current compensated nominal output frequency;
    repeating all of the above steps until said count of said high speed digital counter equals said current compensated nominal output frequency;
    sending a signal to imaging circuitry to produce an output at said compensated nominal output frequency;
    resetting said count of said high speed digital counter to zero;
    storing said current compensated nominal output frequency for use in a next loop cycle; and
    repeating all of the above said steps.

9. The method of claim 8 wherein said input waveform is received from an encoder.

10. The method of claim 9 wherein said encoder is attached to an optical photoreceptor in a printing system.

11. The method of claim 9 wherein said encoder is attached to a detector of a night vision system.

12. The method of claim 8 wherein said operating signal is sent to imaging circuitry to produce an image.

13. The method of claim 12 where said imaging circuitry is a print engine.

14. The method of claim 12 wherein said imaging circuitry is the output of a night vision system.

15. A digital resolution translator, comprising:
    an encoder for generating an input frequency;
    a complex programmable logic device for receiving said input frequency;
    a digital signal processor in communication with said complex programmable logic device operable to translate said input frequency to an adjusted output frequency based upon signals from said complex programmable logic device;
    a buffer for storing transitions in said input frequency and said signals from said complex programmable logic device; and
    an output to imaging circuitry operable to allow said imaging circuitry to receive said adjusted output frequency.

16. The method of claim 1, further comprising the steps of:

compensating said loop error signal;

adding a nominal digital counter value to said compensated loop error signal to obtain a compensated nominal loop error output;

generating said output waveform using said compensated nominal loop error output;

measuring a period of said output waveform by incrementing a high speed counter during said period; and comparing an output of said high speed counter with said compensated nominal loop error output to obtain a fractional component of the output waveform error;

adding the fractional component of the output waveform error to said measured output waveform prior to said step of comparing said scaled input waveform with said measured output waveform to obtain said loop error value.

17. The method of claim 1, further comprising the step of:

scaling said output waveform counter; and wherein said step of comparing said scaled input waveform with said measured output waveform to obtain a loop error value comprises the step of comparing said scaled input waveform with said scaled output waveform.

18. The method of claim 17, further comprising the steps of:

compensating said loop error signal;

adding a nominal digital counter value to said compensated loop error signal to obtain a compensated nominal loop error output, said compensated nominal loop error output used to generate said output waveform;

measuring a period of said output waveform by incrementing a high speed counter during said period; and comparing an output of said high speed counter with said compensated nominal loop error output to obtain a fractional component of the output waveform error;

adding the fractional component of the output waveform error to said scaled output waveform prior to said step of comparing said scaled input waveform with said scaled output waveform to obtain said loop error value.

19. A method of generating an output waveform, comprising the steps of:

measuring an input waveform frequently by incrementing an input waveform counter for each pulse of said input waveform;

measuring an output waveform frequency by incrementing an output waveform counter for each pulse of said output waveform;

scaling said output waveform counter to obtain a scaled output waveform value; comparing said measured input waveform with said scaled output waveform to obtain a loop error value;

using said loop error value to generate said output waveform; and repeating said steps such that said output waveform frequency has a non-integer relationship to said input waveform frequency.

20. The method of claim 19, further comprising the steps of:

compensating said loop error signal;

adding a nominal digital counter value to said compensated loop error signal to obtain a compensated nominal loop error output;

generating said output waveform using said compensated nominal loop error;

measuring a period of said output waveform by incrementing a high speed counter during said period; and comparing an output of said high speed counter with said compensated nominal loop error output to obtain a fractional component of the output waveform error;

adding the fractional component of the output waveform error to said scaled output waveform prior to said step of comparing said measured input waveform with said scaled output waveform to obtain said loop error value.

* * * * *

UNITED STATES PATENT AND TRADEMARK OFFICE
CERTIFICATE OF CORRECTION

PATENT NO.   : 6,476,932 B1
DATED        : November 5, 2002
INVENTOR(S)  : Frank J. Moizio et al.

It is certified that error appears in the above-identified patent and that said Letters Patent is hereby corrected as shown below:

Title page,
Insert Item -- [60]     Related U.S. Application Data
Provisional Application No. 60/024,460    July 26, 1996. --.

Signed and Sealed this

Tenth Day of January, 2006

JON W. DUDAS
*Director of the United States Patent and Trademark Office*